(12) United States Patent
Woo et al.

(10) Patent No.: US 10,701,476 B1
(45) Date of Patent: Jun. 30, 2020

(54) SPEAKER UNIT FOR A VEHICLE

(71) Applicants: HYUNDAI MOTOR COMPANY, Seoul (KR); KIA MOTORS CORPORATION, Seoul (KR)

(72) Inventors: Keunsang Woo, Suwon-si (KR); Zhe Li, Yantai (CN); Min Wu, Yantai (CN); Jeongtae Lee, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/267,532

(22) Filed: Feb. 5, 2019

(30) Foreign Application Priority Data

Dec. 7, 2018  (CN) .......................... 2018 1 1494447

(51) Int. Cl.
```
H04R 1/28      (2006.01)
H04R 5/04      (2006.01)
H03F 3/181     (2006.01)
H04R 1/02      (2006.01)
H04B 1/08      (2006.01)
```

(52) U.S. Cl.
CPC .......... *H04R 1/2819* (2013.01); *H03F 3/181* (2013.01); *H04B 1/082* (2013.01); *H04R 1/025* (2013.01); *H04R 1/2826* (2013.01); *H04R 5/04* (2013.01); *H04R 2499/13* (2013.01)

(58) Field of Classification Search
CPC .... H04R 1/2819; H04R 1/025; H04R 1/2826; H04R 5/04; H04R 5/02; H04R 5/023; H04R 2499/13; H04R 2499/10; H04R 2201/028; H04R 2205/026; H04F 3/181; H04B 1/082; B60R 11/027

USPC .................................. 381/307, 302, 86, 389
See application file for complete search history.

(56) References Cited

U.S. PATENT DOCUMENTS

| | | | | |
|---|---|---|---|---|
| 4,625,328 A * | 11/1986 | Freadman | ................ | H04R 3/04 381/111 |
| 5,164,991 A * | 11/1992 | Johnson | .................... | H03F 1/56 330/297 |
| 5,796,853 A * | 8/1998 | Lee | .......................... | H03F 3/187 381/120 |
| 2006/0222182 A1* | 10/2006 | Nakaishi | ................. | H04S 7/302 381/27 |
| 2006/0222199 A1* | 10/2006 | Abe | ........................ | H04R 9/025 381/396 |
| 2007/0140519 A1* | 6/2007 | Fukuyama | ................ | H04R 7/24 381/398 |
| 2009/0180648 A1* | 7/2009 | Endo | ......................... | H04R 1/24 381/184 |

FOREIGN PATENT DOCUMENTS

| KR | 10-2008-0060497 A | 7/2008 |
|---|---|---|
| KR | 10-1526749 B1 | 6/2015 |

\* cited by examiner

*Primary Examiner* — Ahmad F. Matar
*Assistant Examiner* — Sabrina Diaz
(74) *Attorney, Agent, or Firm* — McDonnell Boehnen Hulbert & Berghoff LLP

(57) ABSTRACT

A speaker unit for a vehicle includes a subwoofer unit for outputting sound in a base sound region, an amplifier (AMP) circuit unit mounted on a side of the subwoofer unit for amplifying an acoustic current signal and supplying the amplified acoustic current signal to the subwoofer unit, and an amplifier protection cover unit coupled to the subwoofer unit at one side of the subwoofer unit and configured to cover the amplifier circuit unit.

7 Claims, 7 Drawing Sheets

FIG. 6

| Cooling method | Time (min) | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | MAX |
|---|---|---|---|---|---|---|---|---|---|---|---|---|---|---|---|---|---|---|---|---|---|---|---|---|---|---|---|---|
| heat sink only | Temperature (°C) | 23.6 | 30.9 | 38.1 | 44 | 49.7 | 54.6 | 59.1 | 63 | 68.3 | 69.2 | 71.4 | 73.6 | 75.3 | 76.7 | 77.9 | 79 | 79.8 | 80.5 | 81.2 | 81.8 | 82.4 | 82.7 | 83.2 | 83.5 | 83.7 | 83.7 | 83.7 |
| heat sink + Vibration wind generated from vibration plate | | 23.9 | 27.9 | 30.7 | 32.5 | 34.1 | 35.8 | 37.3 | 38.7 | 39.5 | 40.2 | 41.7 | 42 | 42.2 | 41.1 | 42.3 | 42.7 | 42.6 | 42.8 | 42.7 | 43.3 | 44.1 | 43.2 | 43.2 | 43.5 | 43.5 | 43.4 | 44.1 |

SPEAKER UNIT FOR A VEHICLE

CROSS-REFERENCE TO RELATED APPLICATION

This application claims priority to and the benefit of Chinese Patent Application No. 201811494447.3 filed in the Chinese Property Office on Dec. 7, 2018, the entire contents of which are incorporated herein by reference.

BACKGROUND (a) Field

The present disclosure relates to a speaker unit for a vehicle, more particularly, to a speaker unit for a vehicle which is provided with a subwoofer with an amplifier circuit.

(b) Description of the Related Art

A speaker is a device for outputting an audio signal in a voice (acoustic) form so that a listener can listen to the input audio signal. A speaker may include a general speaker for outputting a voice in a treble range and a woofer speaker for outputting a voice in a bass range. A device for amplifying and supplying a voice current signal to a speaker device is referred to as an amplifier (AMP), and a voltage or power of the signal applied to the input side is amplified and output with a large change in energy to the output side.

As automobile manufacturers become more competitive, there is a growing pressure on cost reduction and light weight vehicles in order to enhance competitiveness among automobile manufacturers, and it is recognized that lighter weight is a part of the development direction for automobile companies. Theoretically, when the vehicle weight is reduced by about 100 kg, the fuel consumption of about 0.4 L is reduced when the vehicle is driven at 100 km.

Under the premise of performance assurance, a light weight vehicle benefits both the consumer and the environment, as a result of reduced fuel consumption and environmental protection. One method for reducing the weight of a vehicle includes eliminating an external amplifier. Vehicle performance can be further improved by replacing the weight reduction part due to the removal of the vehicle exterior amplifier with other important parts. The size of the external amplifier for driving the subwoofer unit takes up a considerable amount of space, it is difficult to secure a space for installation, and it is necessary to change many parts, such as the body and the chair. In addition, the external amplifier requires a large heat sink and the like, and even if the amount of increase of about 1 kg is applied, the fuel consumption is greatly influenced. Therefore, a technique for integrating an external amplifier into a subwoofer using the structure of a speaker unit has been studied.

The above information disclosed in this Background section is only for enhancement of understanding of the background of the invention and therefore it may contain information that does not form the prior art that is already known in this country to a person of ordinary skill in the art.

SUMMARY

It is an object of the present disclosure to provide a speaker unit having a structure in which an external amplifier is mounted on a subwoofer using a side structure of a speaker unit without changing the structure of an existing audio system.

A speaker unit for a vehicle according to an embodiment of the present disclosure includes a subwoofer unit for outputting sound in a base sound region, an amplifier (AMP) circuit unit mounted on a side of the subwoofer unit for amplifying an acoustic current signal and supplying the amplified acoustic current signal to the subwoofer unit, and an amplifier protection cover unit coupled to the subwoofer unit at one side of the subwoofer unit and configured to cover the amplifier circuit unit.

The subwoofer unit includes a subwoofer frame, a vibration plate coupled to the subwoofer frame at one side of the subwoofer frame and vibrating up and down to generate sound, a voice coil coupled to a center of the vibration plate and receiving acoustic signal to transmit the vibration to the vibration plate, a magnet coupled to a central portion of the voice coil to vibrate the voice coil up and down using a magnetic force of a permanent magnet, and a yoke for fixing the vibration plate, voice coil, and magnet to the subwoofer frame.

The subwoofer frame may be provided with an amplifier inserting portion on one side thereof to which the amplifier circuit unit is inserted.

The vibration plate may be formed of one of paper, synthetic material, and a metal plate.

Vertical vibration width of the vibration plate may be about 10 mm or more and about 20 mm or less.

The subwoofer unit may receive an acoustic signal from a head unit, the acoustic signal may be transmitted to the voice coil, and the vibration plate may vibrate due to the vertical vibration of the voice coil.

The amplifier circuit unit mounted on the subwoofer unit may be electrically connected to front left and right door speakers and rear left and right door speakers of the vehicle and amplify acoustic signal generated from the front left and right door speakers and rear left and right door speakers.

The amplifier circuit unit may be cooled by using the wind generated by the vibration of the vibration plate.

The amplifier protection cover unit may be formed of a high heat-resistant and high-strength injection material.

The amplifier protection cover unit may include a plurality of through slits formed to penetrate the amplifier protection cover unit.

According to an embodiment, by installing the amplifier on the side surface of the subwoofer frame without changing the structure of the existing speaker system, it is possible to secure a considerable space in the vehicle and realize the weight saving of the vehicle.

In addition, the present arrangement can contribute to a lower vehicle cost, and can be easily applied to a vehicle having improved commerciality without a large change in the layout of the vehicle, and is easily applicable to low-cost/small-sized vehicles.

In addition, due to the simplification of the structure of the speaker unit, there is a time saving effect on manufacturing.

In addition, the cooling effect can be improved by directly cooling the amplifier circuit unit using the air flow caused by the vibration of the vibration plate.

BRIEF DESCRIPTION OF THE DRAWINGS

Exemplary aspects are illustrated in the drawings. It is intended that the embodiments and figures disclosed herein are to be considered illustrative rather than restrictive.

FIG. 6 is a time-dependent temperature chart comparing the heat dissipation effect of the speaker unit for a vehicle according to an embodiment and the heat dissipation effect of the speaker unit composed only of a heat sink.

DETAILED DESCRIPTION

Figure 1:
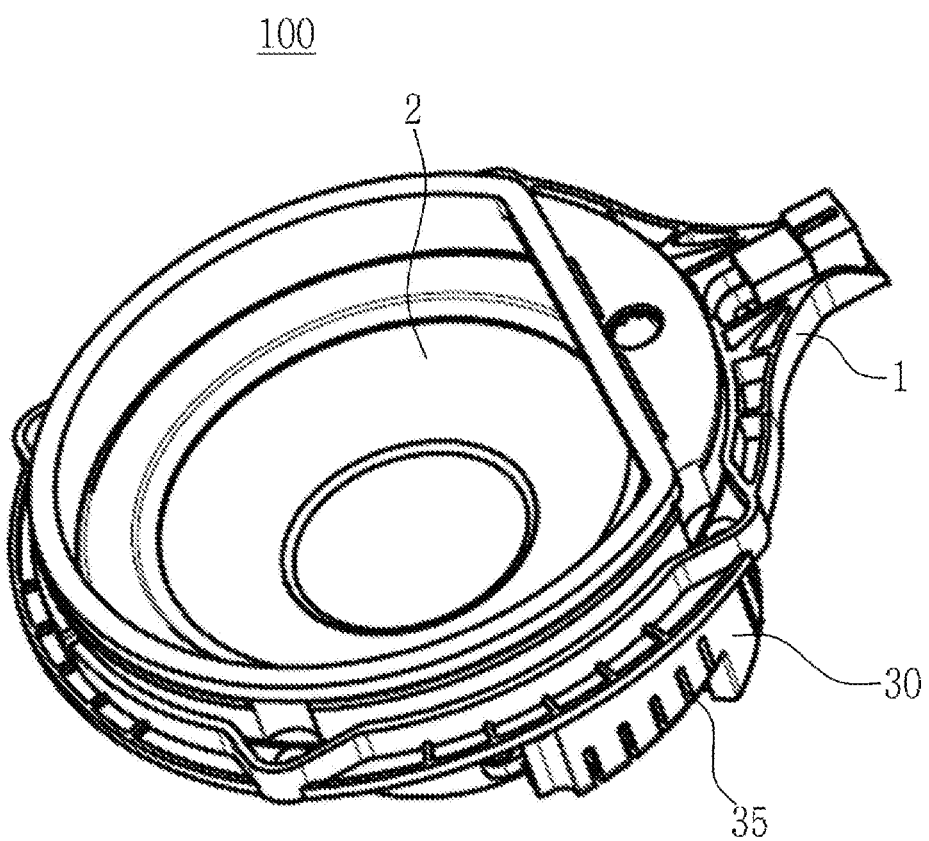
FIG. 1 is a front perspective view schematically showing a speaker unit for a vehicle according to an embodiment of the present disclosure.
Figure 2:
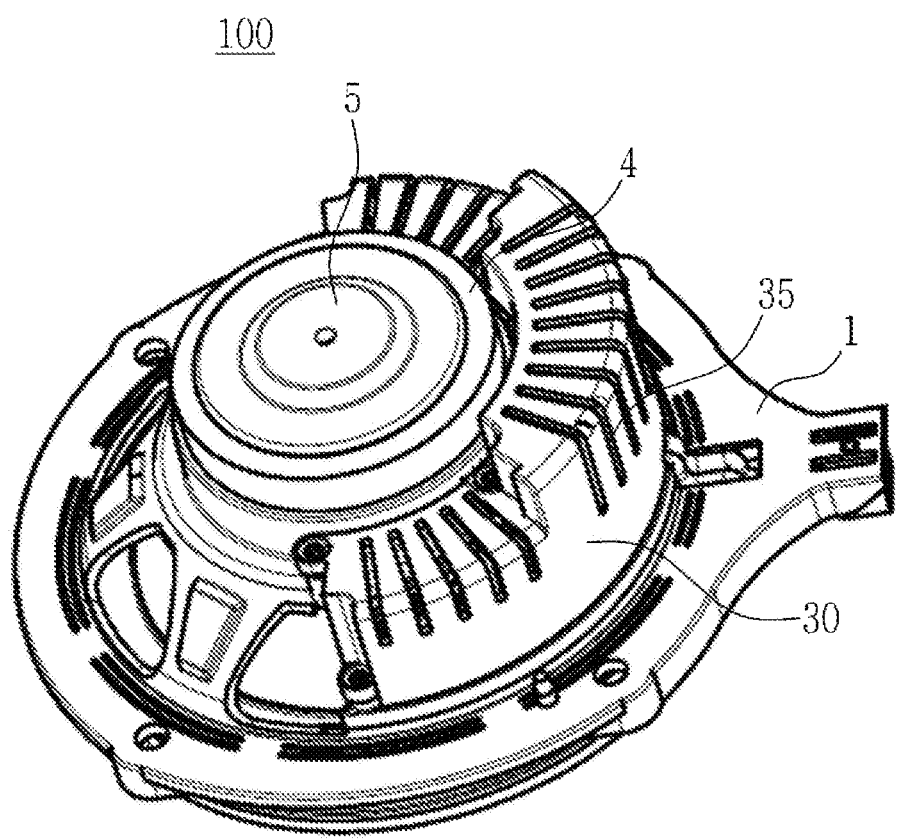
FIG. 2 is a rear perspective view schematically showing a speaker unit for a vehicle according to an embodiment.

Hereinafter, the present disclosure will be described more fully with reference to the accompanying drawings, in which exemplary embodiments are shown. As those skilled in the art would realize, the described embodiments may be modified in various different ways, all without departing from the spirit or scope of the present disclosure.

Further, in exemplary embodiments, since like reference numerals designate like elements having the same configuration, a first exemplary embodiment is representatively described, and in other exemplary embodiments, only configurations different from the first exemplary embodiment will be described.

The drawings are schematic, and are not illustrated in accordance with a scale. Relative dimensions and ratios of portions in the drawings are illustrated to be exaggerated or reduced in size for clarity and convenience, and the dimensions are just exemplified and are not limiting. In addition, same structures, elements, or components illustrated in two or more drawings use same reference numerals for showing similar features. It will be understood that when an element such as a layer, film, region, or substrate is referred to as being "on" another element, it can be directly on the other element or intervening elements may also be present.

A speaker unit for a vehicle according to an embodiment is described with reference to FIGS. 1 to 4.

Referring to FIG. 1 to FIG. 4, a speaker unit for a vehicle 100 includes a subwoofer unit 10, an amplifier (AMP) circuit unit 20, and an amplifier protection cover unit 30.

The subwoofer unit 10 outputs sound in a base sound region, that is, a base sound region in a band of about 20 Hz to about 99 Hz.

Figure 4:
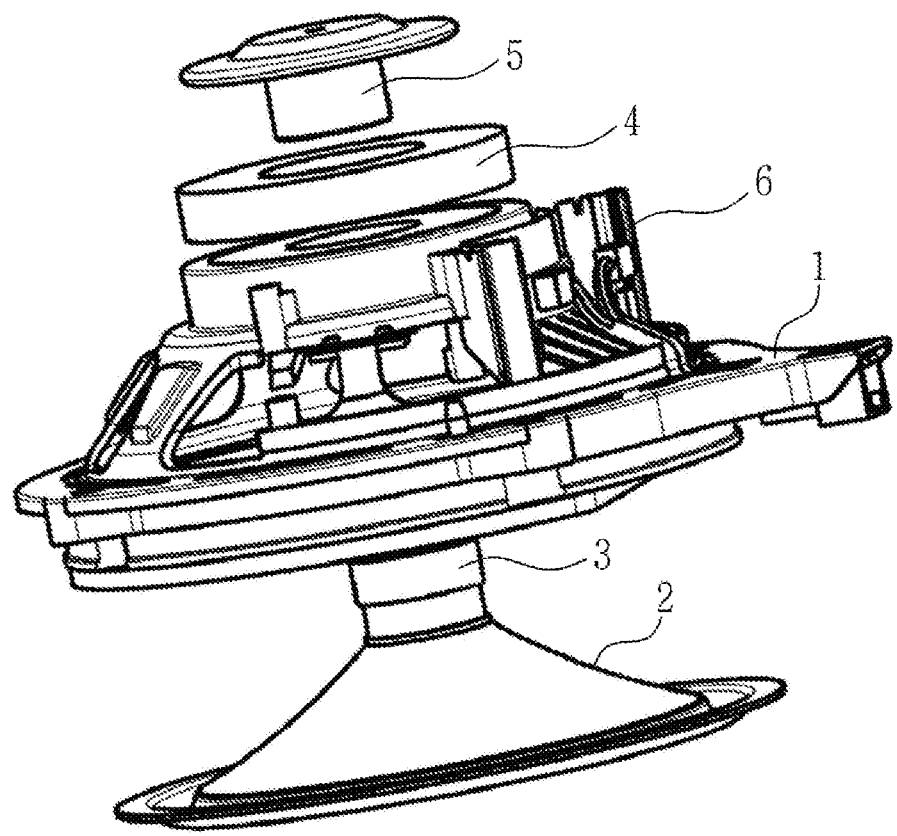
FIG. 4 is an exploded perspective view schematically showing a subwoofer unit according to an embodiment.

As shown in FIG. 4, the subwoofer unit 10 has a structure including a subwoofer frame 1, a vibration plate 2, a voice coil 3, a magnet 4, and a yoke 5.

The vibration plate 2 is located at one side of the subwoofer frame 1 and is coupled to the subwoofer frame 1 and generates sound while vibrating up and down. The vibration plate may be formed of one of paper, synthetic material, and a metal plate. The vibration plate 2 may be formed in a corrugated shape, and the material of the vibration plate 2 may be any one of pulp, talc, mica, polypropylene, graphite, glass fiber, carbon, and aluminum. Vertical vibration width of the vibration plate may be about 10 mm or more and about 20 mm or less.

The voice coil 3 is coupled to the center of the vibration plate 2 and receives an acoustic signal to transmit the vibration to the vibration plate 2. An iron piece is provided at the center of the voice coil 3, and when a voice current flows through the voice coil 3, the iron piece vibrates and the vibration of the iron piece is transmitted to the vibration plate 2 to radiate sound.

The magnet 4 is coupled to the center portion of the voice coil 3 and causes the voice coil 3 to vibrate up and down using the magnetic force (magnetic field) of a permanent magnet. The magnet 4 may include a rare earth magnet or a ferrite magnet.

The yoke 5 fixes the vibration plate 2, the voice coil 3 and the magnet 4 to the subwoofer frame 1.

The subwoofer frame 1 may be provided with an amplifier inserting portion 6 on one side thereof to which the amplifier circuit unit 20 is inserted. The amplifier inserting section 6 may be formed integrally with the subwoofer frame 1. The amplifier circuit unit 20 may be formed in a rectangular plate shape, and the amplifier inserting unit 6 may hold the both side edges of the amplifier circuit unit 20 to connect the amplifier circuit unit 20 to the subwoofer unit 20.

Figure 3:
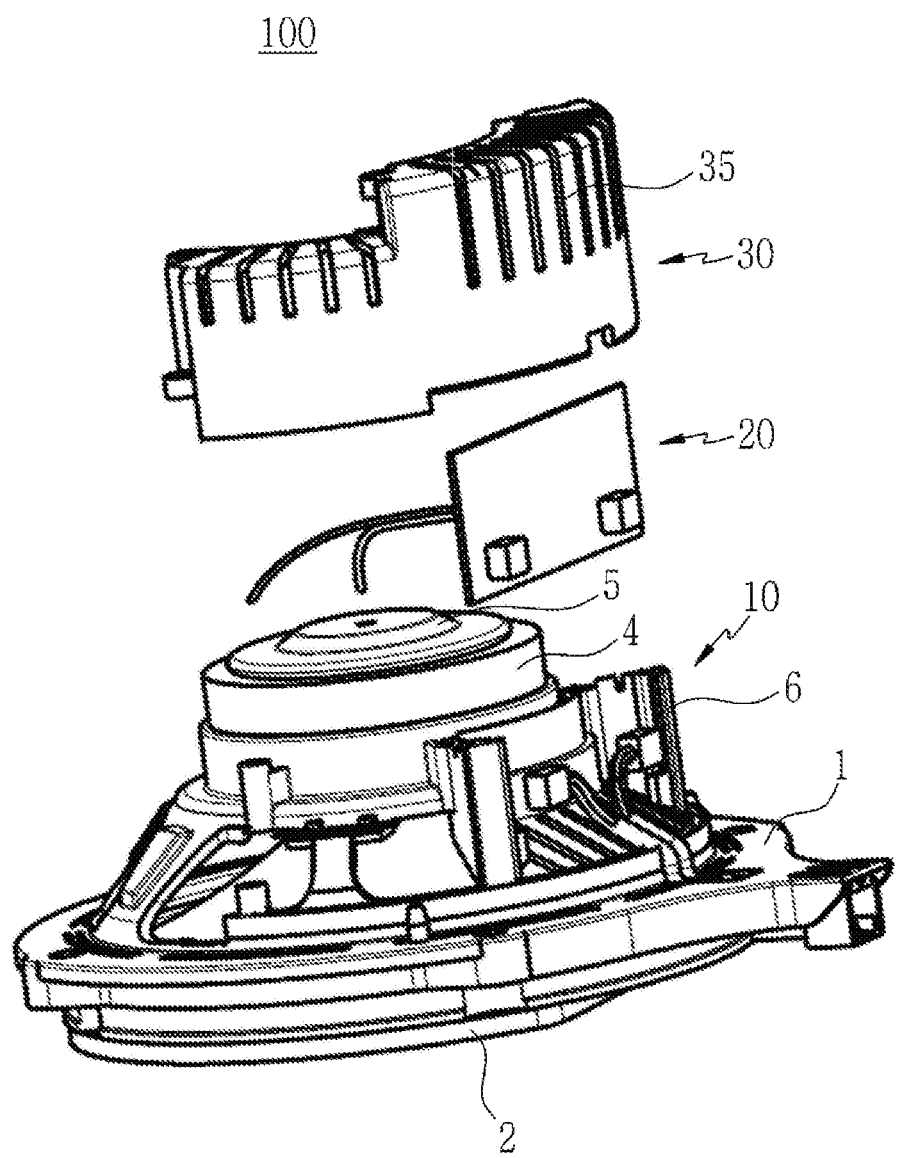
FIG. 3 is an exploded perspective view schematically showing a speaker unit for a vehicle according to an embodiment.

As shown in FIG. 3, the amplifier protection cover unit 30 may be coupled to the subwoofer unit 10 from one side of the subwoofer unit 10 and cover the amplifier circuit unit 20. The amplifier protection cover unit 30 and the subwoofer unit 10 may be coupled using a screw.

The amplifier protection cover unit may be formed of a high heat-resistant and high-strength injection material, and may be formed of high heat resistant Aramid fibers.

The amplifier protection cover unit 30 may include a plurality of through slits 35 formed to penetrate the amplifier protection cover unit 30. The penetrating slit 35 has the same shape as the sash structure and may radiate the heat generated in the amplifier circuit unit 20 to the outside.

Figure 5:
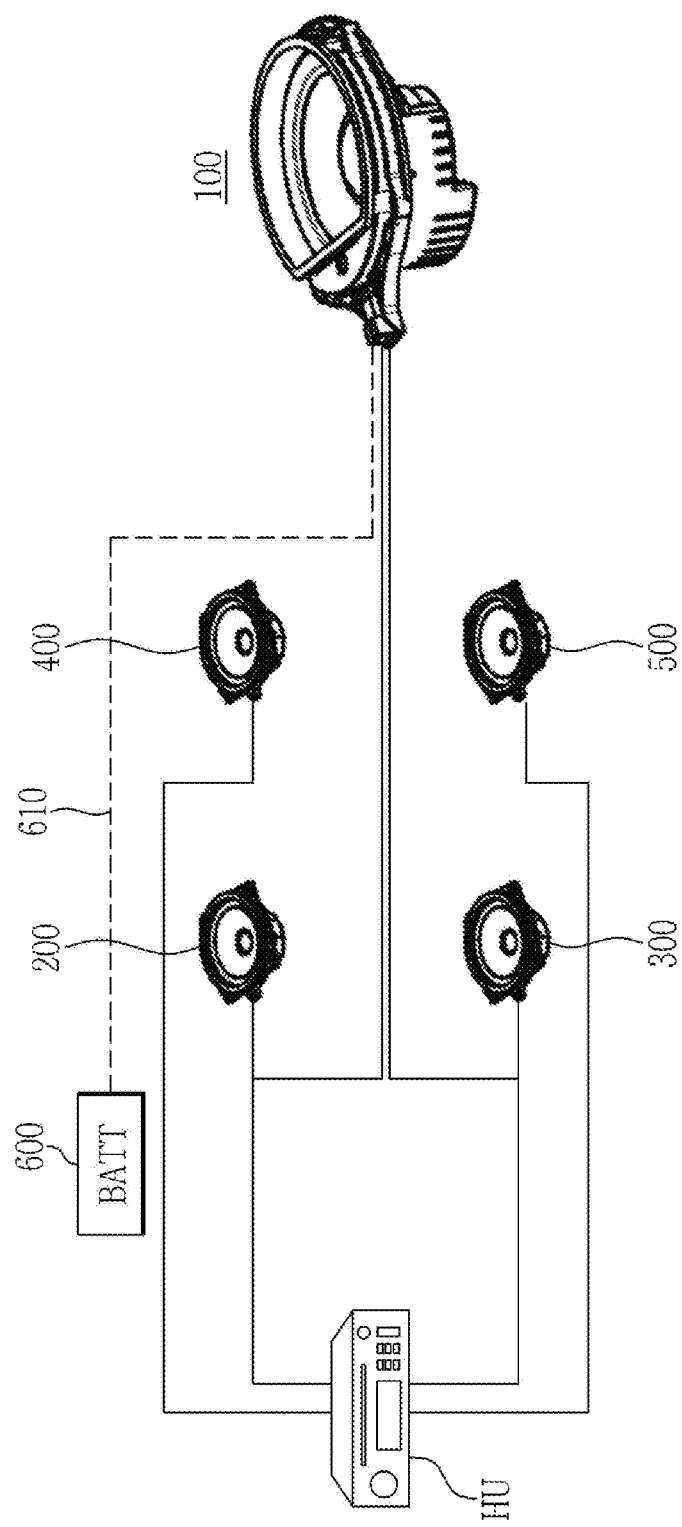
FIG. 5 is a schematic view showing a connection relationship between a speaker unit for a vehicle according to an embodiment in a vehicle and other speakers.

Referring to FIG. 5, the amplifier circuit unit 20 mounted on the subwoofer unit 10 receives power from a battery 600 and amplifies an acoustic signal transmitted from a head unit HU. The speaker unit for a vehicle 100 is electrically connected to the front left and right door speakers 200 and 300 of the vehicle and the rear left and right door speakers 400 and 500 of the vehicle, and the amplifier circuit unit 20 can amplify the acoustic signals generated from the door speakers 200, 300, 400 and 500.

Meanwhile, the vibration plate 2 of the subwoofer unit 10 vibrates up and down to generate wind, and the amplifier circuit unit 20 can be cooled using the wind.

Figure 7:
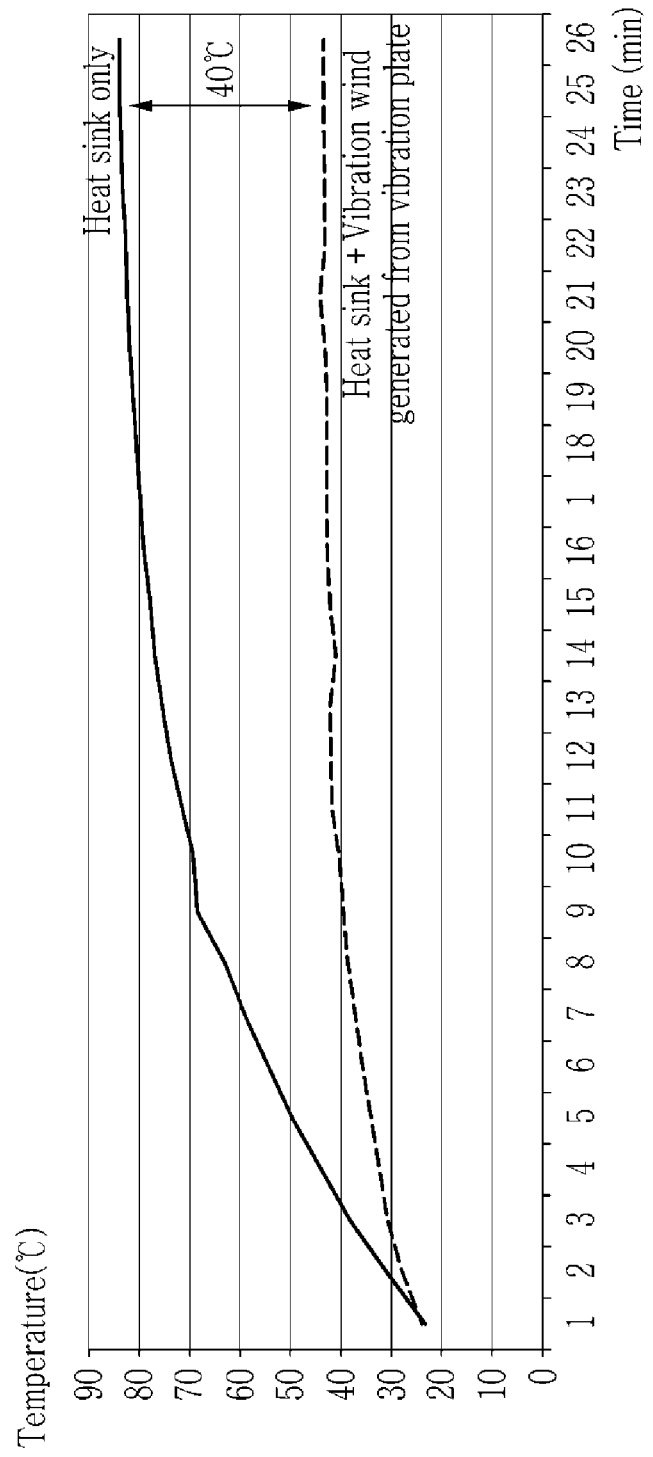
FIG. 7 is a time-dependent temperature graph comparing the heat dissipation effect of the speaker unit for a vehicle according to an embodiment and the heat dissipation effect of the speaker unit composed only of a heat sink.

Referring to FIG. 6 and FIG. 7, when the speaker unit for a vehicle 100 is provided with a heat sink and the amplifier circuit unit 20 is cooled only by the heat sink, the temperature of the amplifier circuit unit 20 after cooling for about 25 minutes was measured to be 83.7° C. as a maximum temperature.

In addition, when the speaker unit for a vehicle 100 is provided with a heat sink and the amplifier circuit unit 20 is cooled by the heat sink and the wind generated by the up and down vibration of the vibration plate 2 of the subwoofer unit 10 according to the exemplary embodiment of the present invention, the temperature of the amplifier circuit unit 20 after cooling for about 25 minutes was measured to be 44.1° C., as a maximum temperature.

In other words, when the wind generated by the up and down vibration of the vibration plate 2 of the subwoofer unit 10 in addition to the heat sink is simultaneously used for cooling, the cooling effect was remarkably improved.

Thus, by installing the amplifier on the side surface of the subwoofer frame without changing the structure of the existing speaker system, it is possible to secure a considerable space in the vehicle and realize the weight saving of the vehicle.

In addition, the present arrangement can contribute to a lower vehicle cost, and can be easily applied to a vehicle having improved commerciality without a large change in the layout of the vehicle, and is easily applicable to low-cost/small-sized vehicles.

In addition, due to the simplification of the structure of the speaker unit, there is a time saving effect on manufacturing.

In addition, the cooling effect can be improved by directly cooling the amplifier circuit unit using the air flow caused by the vibration of the vibration plate. While a number of exemplary aspects have been discussed above, those of skill in the art will recognize that still further modifications, permutations, additions and sub-combinations thereof of the disclosed features are still possible. It is therefore intended that the following appended claims and claims hereafter introduced are interpreted to include all such modifications, permutations, additions and sub-combinations as are within their true spirit and scope.

The invention claimed is:

1. A speaker unit for a vehicle, comprising:
   a subwoofer unit for outputting sound in a base sound region;
   an amplifier (AMP) circuit unit mounted on a side of the subwoofer unit for amplifying an acoustic current signal and supplying the amplified acoustic current signal to the subwoofer unit; and
   an amplifier protection cover unit coupled to the subwoofer unit at one side of the subwoofer unit and configured to cover the amplifier circuit unit, wherein the amplifier protection cover unit includes a plurality of through slits formed to penetrate the amplifier protection cover unit;
   wherein the subwoofer unit includes:
      a subwoofer frame having an amplifier inserting portion integrally formed on one side thereof to which the amplifier circuit unit is inserted, wherein the amplifier inserting portion and the amplifier circuit unit have corresponding shapes;
      a vibration plate coupled to the subwoofer frame at one side of the subwoofer frame and vibrating up and down to generate sound;
      a voice coil coupled to a center of the vibration plate and receiving an acoustic signal to transmit the vibration to the vibration plate;
      a permanent magnet magnetically coupled to a central portion of the voice coil to vibrate the voice coil up and down using a magnetic force; and
      a yoke for fixing the vibration plate, voice coil, and magnet to the subwoofer frame.

2. The speaker unit for a vehicle of claim 1, wherein the vibration plate is formed of one of paper, synthetic material, and a metal plate.

3. The speaker unit for a vehicle of claim 1, wherein the vibration plate vibrates with a width ranging from 10 mm to 20 mm.

4. The speaker unit for a vehicle of claim 1, wherein the subwoofer unit receives the acoustic signal from a head unit, the acoustic signal is transmitted to the voice coil, and the vibration plate vibrates due to a vertical vibration of the voice coil.

5. The speaker unit for a vehicle of claim 4, wherein the amplifier circuit unit mounted on the subwoofer unit is electrically connected to front left and right door speakers and rear left and right door speakers of the vehicle and amplifies an acoustic signal generated from the front left and right door speakers and rear left and right door speakers.

6. The speaker unit for a vehicle of claim 1, wherein the amplifier circuit unit is cooled by using wind generated by the vibration of the vibration plate.

7. The speaker unit for a vehicle of claim 1, wherein the amplifier protection cover unit is formed of a high heat-resistant and high-strength injection material.

* * * * *